(12) United States Patent
Bean

(10) Patent No.: US 7,107,160 B2
(45) Date of Patent: Sep. 12, 2006

(54) USE-ADAPTIVE FUEL GAUGING FOR BATTERY POWERED ELECTRONIC DEVICES

(75) Inventor: Heather N Bean, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 239 days.

(21) Appl. No.: 09/974,372

(22) Filed: Oct. 9, 2001

(65) Prior Publication Data

US 2003/0069704 A1    Apr. 10, 2003

(51) Int. Cl.
*G01R 31/36* (2006.01)

(52) U.S. Cl. ......................................... 702/63; 320/136

(58) Field of Classification Search ........ 320/132–136; 324/426, 427; 702/63; 340/316.1–363.21
See application file for complete search history.

(56) References Cited

U.S. PATENT DOCUMENTS

| | | | |
|---|---|---|---|
| 4,743,831 A * | 5/1988 | Young | 320/127 |
| 5,349,535 A | 9/1994 | Gupta | 364/483 |
| 5,508,599 A | 4/1996 | Koenck | 320/21 |
| 5,808,445 A * | 9/1998 | Aylor et al. | 320/132 |
| 6,137,292 A | 10/2000 | Hirsch et al. | 324/427 |
| 6,191,551 B1 * | 2/2001 | Fischer et al. | 320/106 |
| 6,252,380 B1 | 6/2001 | Koenck | 320/150 |
| 6,313,609 B1 * | 11/2001 | Brink | 320/132 |
| 6,377,028 B1 * | 4/2002 | Armstrong et al. | 320/136 |

* cited by examiner

*Primary Examiner*—Marc S. Hoff
*Assistant Examiner*—Mary Catherine Baran

(57) ABSTRACT

A method and a battery powered electronic device incorporate use-adaptive fuel gauging. The use-adaptive fuel gauging adapts a fuel gauge algorithm to an average use model for the device. The adaptation accounts for the effects that variations in average use by a user of the device have on a total available energy or charge capacity of a battery. Accordingly, use-adaptivity can improve the fuel gauging accuracy by improving an estimate of the total energy available. The method and device optionally account for different battery chemistries yielding further increases in fuel gauging accuracy compared to conventional fuel gauging approaches.

35 Claims, 4 Drawing Sheets

USE-ADAPTIVE FUEL GAUGING FOR BATTERY POWERED ELECTRONIC DEVICES

TECHNICAL FIELD

The invention relates to battery powered electronic devices. In particular, the invention relates to battery fuel gauging that indicates a charge remaining in a battery.

BACKGROUND OF THE INVENTION

Battery-powered electronic devices, devices that derive some or all of their operating power from a battery, are popular, widely available, and in widespread use. In large part, the ultimate value and marketability of such devices depend on reliable battery power. Thus, given the importance of reliable battery power, most battery-powered electronic devices provide some form of a battery 'fuel gauge'. The fuel gauge, generated by 'fuel gauging', displays a suggestion or indication of a remaining energy or charge level of the battery. Accurate fuel gauging generally enhances the reliability and predictability of a battery powered device. In contrast, inaccurate fuel gauging can actually decrease the apparent reliability of the battery-powered device.

First and foremost, fuel gauging is employed to keep a user of the device apprised of a current or remaining battery charge level. In addition, fuel gauging sometimes can provide an indication of probable remaining operating time of the electronic device. Using information supplied by a displayed fuel gauge reading, the user can determine whether or not the battery is likely to have sufficient remaining energy for the task at hand. If the user determines that the battery lacks sufficient energy based on the fuel gauge reading, the user can either replace the battery or, in the case of a rechargeable battery, recharge the battery. Thus, fuel gauging helps the user avoid an inconvenient or detrimental loss of operational power during the task due to insufficient available battery energy.

In addition to providing information to the user, fuel gauging, or more precisely, data collected by the electronic device and used to generate and display the fuel gauge reading, is often used by the device to determine whether or not a predetermined cut-off point in a discharge profile of the battery has been reached. As used herein, the cut-off point is a point in the discharge cycle of the battery at which there is insufficient remaining available energy to meet a given voltage and/or current requirement of the device using the battery. By detecting if and when the cut-off point has been reached, the device can initiate a 'soft shut-down', among other things. Such a device-initiated soft shut-down can help to prevent or at least mitigate various inopportune or inconvenient consequences of an unexpected loss of adequate operational power at or near an 'end of charge' of the battery.

While accurate battery fuel gauging is useful for and enhances the reliability of battery powered electronic devices, implementing such fuel gauging is not a simple, straightforward task. As is well known in the art, a battery is a device that stores energy as chemical energy and, when called upon to release the stored energy, converts the chemical energy into electrical energy. The battery delivers the electrical energy to a circuit or device attached to the battery as an electric current and voltage. Unfortunately, there is no convenient, direct means of determining or measuring an existing or remaining energy or charge level stored in a given battery. Moreover, there is no direct, convenient way to determine how much of the stored chemical energy is actually available to the device.

Thus, fuel gauging must generally employ an indirect means to predict or infer the remaining charge level of a battery. In most cases, battery characteristics, such as battery voltage and/or battery current, as a function of time, are used to deduce the charge level. The measured data front monitoring one or more of these battery characteristics are then translated into a fuel gauge reading or result using a fuel gauge algorithm.

To emphasize further these points, consider the problem of determining a total available energy of a battery. The total available energy of a battery is how ninth energy a battery can deliver to the device during a complete discharge cycle. Some measure of total energy available is normally used for fuel gauging. The total available energy from the battery typically depends on a number of variables. In fact, the total available energy generally depends on a chemistry of the battery, a physical size of the battery, a manufacturer of the battery, and how the battery is used by the device (i.e., load conditions to which the battery is subjected). Ultimately, the total available energy from a given battery is determined by how much energy is actually extracted from the battery before the cut-off point is reached. Thus, without draining the battery, the total available energy from the battery is difficult to ascertain.

Returning again to the general problem of fuel gauging, there are essentially two main techniques or fuel gauge algorithms employed to perform furl gauging in battery powered electronic devices: energy monitoring and voltage slope monitoring. Energy monitoring, sometimes called current monitoring, relies on monitoring energy flowing into and out of the battery as a function of time. If a total available energy at a starting point is known, then by measuring energy flowing into and out of the battery, a net change in the total available energy can be computed. This technique has the advantage that it measures energy flow directly. The disadvantages of this technique include a need to know the total available energy at a starting point. Since total available energy is strongly dependent on battery chemistry, size, manufacturer, and dynamic load conditions during discharge, this technique is most often used with application specific battery packs. An application specific battery pack is a custom packaged battery designed for a specific application or device. The performance characteristics, including total available energy of application specific battery packs, can be tightly controlled by the device manufacturer to minimize expected errors in fuel gauging.

Voltage slope monitoring, on the other hand, monitors a change in battery voltage as a function of time (dv/dt). A measured value of voltage is then used to determine a remaining amount of energy. The effectiveness of voltage slope monitoring depends on having an accurate relationship between the measured voltage value and the remaining energy level. Typically this is done using a curve or look-up table that relates energy to voltage. The advantage of voltage slope monitoring is that it can be implemented easily in most devices. The disadvantages include the need to construct the curve or look-up table to accommodate a range of possible actual relationships between voltage and energy. At the very least, the curve or look-up table must take into account a range of energy capacities provided by different manufacturers of batteries of appropriate form factors that can be used in the device. The problem is further exacerbated in devices that can use batteries having any one of multiple different chemistries and made worse yet by the fact that the battery voltage at a given energy level is highly dependent on the load that the battery is encountering.

The 'chemistry' of the battery refers to the specific combination of electrolytes and electrode materials used in the battery to create and sustain chemical reactions within the battery that produce the electricity. A variety of different battery chemistries are currently commercially available including alkaline, high-drain alkaline, nickel-metal hydride (NiMH), nickel-cadmium (NiCd), and photo lithium or lithium-iron sulfide (Li—$FeS_2$). Moreover, all of these chemistries are available in a variety of common battery sizes or form factors, including, but not limited to, an 'AA' size.

The relevance of the chemistry of a battery to fuel gauging is due to a direct relationship between the chemical reactions and the electrical characteristics of the battery. Essentially all measurable electrical characteristics of a given battery, including but not limited to, open-circuit voltage, loaded voltage, charge capacity, peak current and even re-chargeability, are a direct result of the specific chemical reactions taking place within the battery. The unique qualities of a battery's chemical reaction, such as reaction rate, reaction path, and reactants involved, are sometimes referred to collectively as the 'reaction kinetics' or simply 'kinetics' of the battery. The reaction kinetics of the battery dictate the electrical characteristics of the battery. Thus, any of the electrical characteristics of the battery that might be usefully monitored for fuel gauging will be directly affected by or depend on the battery chemistry.

For example, the open-circuit voltages at full charge, mid charge and at the cut-off point can and do differ from one chemistry to another. In addition, peak current levels and internal resistance levels differ among the various chemistries leading to different measured voltages when the batteries are placed under a load. Thus, a fuel gauging approach designed or 'calibrated' for one chemistry may not be particularly accurate or effective for another chemistry even when using the same form factor.

As if the problems associated with using indirect methods for determining battery charge level were not complicated enough by multiple battery chemistries and multiple manufacturers, the total energy capacity of a given battery of a given chemistry from a given manufacturer can and does vary depending on how the battery is used in a particular device and how a given user employs the device as noted above. For example, alkaline batteries can deliver significantly more total energy over the course of a discharge cycle when subjected to low average load conditions as opposed to high average load conditions. In fact, an alkaline battery may provide as little as one-tenth the total energy output under high load conditions than under low load conditions.

Furthermore, batteries of various chemistries behave differently when subjected to dynamic or changing high and/or low load conditions. The measured voltage of a battery is directly affected by the load condition to which the battery is subjected. For example, batteries exhibit a phenomenon known as voltage recovery when a low load condition follows a high load condition. The voltage recovery, in turn, can produce erroneous readings by the fuel-gauging algorithm of the device. Thus, a given 'use model' or model of how the battery is used by a given device and how the user of the device employs the device during the battery discharge cycle, can and does impact the accuracy of the battery fuel gauging performed by the device.

Accordingly, it would be advantageous to have fuel gauging for battery powered electronic devices, wherein the accuracy of the fuel gauging is less sensitive to the effects of differing use models in different electronic devices than conventional fuel gauging.

SUMMARY OF THE INVENTION

The present invention is a method of use-adaptive fuel gauging for a battery powered electronic device and an electronic device having use-adaptive fuel gauging. In particular, the present invention actively keeps track of and updates a history of available energy capacity for batteries used in the device. The history is a function of a use pattern for an individual device by a particular user. Thus, the fuel gauging adapts to a particular way a given device is used by the user. The use-adapted fuel gauging can provide improved accuracy compared to conventional fuel gauging that is not adapted and thus, uses a fuel gauge algorithm that is common to all devices of a given type. In addition, the present invention can also adapt to differing battery chemistries yielding additional improvements in fuel gauging accuracy in devices that employ batteries of any one of multiple different chemistries.

In one aspect of the present invention, a method of use-adaptive fuel gauging is provided. The method of use-adaptive fuel gauging comprises monitoring a net energy extracted from the battery as a function of time during operation of the device. The net energy extracted is a difference between energy flowing into and out of the battery during operation. Energy flowing into and out of the battery can be monitored by measuring an actual energy flow or by estimating the energy flow based on operations performed by the device. The method of use-adaptive fuel gauging further comprises updating an estimate of total available energy or energy capacity once the battery has been fully discharged. Thus, each time a battery is fully discharged, the estimated total energy capacity is updated to reflect an actual measured energy capacity. In general, the estimated total available energy improves with time since it is based on actual performance characteristics as opposed to assumed, or predefined performance characteristics of the battery. The method further comprises adapting the fuel gauging to the estimated total available energy. The fuel gauging is adapted to take into account the estimated total available energy for the battery. Among other things, the adapted fuel gauging can be used to create a fuel gauge display and detect whether or not a cut-off point in the battery discharge profile has been reached.

The method of use-adaptive fuel gauging optionally further comprises determining a battery chemistry of the battery. Optionally determining the battery chemistry can be performed at any point in the performance of the method. Preferably, if the battery chemistry is determined, it is determined prior to monitoring the net energy extracted. Results of determining battery chemistry are used to further adapt the fuel gauging. Additionally, the determined battery chemistry can be used to adjust the results of monitoring the net extracted energy. Adapting to a determined chemistry can further improve the fuel gauging results by adding knowledge of the battery chemistry to the method.

In another aspect of the invention, an electronic device having use-adaptive fuel gauging of a battery that is used for power is provided. The electronic device comprises a battery monitor, a controller, a memory, a user interface and a fuel gauge algorithm in the form of a computer program stored in the memory. The battery monitor monitors a characteristic of the battery and outputs energy-flow data to the controller. The battery monitor may be a physical component or subsystem of the device that actually measures energy flow or may be a virtual component or subsystem that utilizes operational action information of the device to estimate energy flow. In one or more embodiments, the electronic device is a digital camera.

The controller executes the computer program that implements the method of the present invention and uses the measured or estimated energy flow data. In particular, the controller optionally determines battery chemistry, and checks a charge level when the battery is replaced. The controller also receives the energy flow data, records the data in the device memory, and uses the data to monitor the net energy extracted from the battery. When the battery reaches a cut-off point and is fully discharged, the controller updates an estimate of the total energy capacity for the battery. Additionally, the controller adapts the fuel gauging to account for the updated estimated total available energy and the optionally determined battery chemistry. The controller may also format fuel gauge results and display the results using the user interface. Advantageously in some cases, the use-adaptive fuel gauging of the present invention can be implemented as a firmware upgrade to an existing electronic device using existing battery monitoring components and other components of the electronic device.

The present invention provides for more accurate battery fuel gauging than conventional approaches in a number of ways. In particular, the total energy capacity of the battery, from which a fuel gauge reading is generated, is based on historical data for the device itself and on historical data regarding how the user makes use of the device. Thus, the fuel gauging of the present invention is less affected by inappropriate or incorrect assumptions made during device design regarding a particular use model for the device. The fuel gauging adapts to a particular use pattern of a specific user. Moreover, since many users often have 'favorite' or preferred battery manufacturers, the use-adaptive fuel gauging of the present invention also tends to mitigate errors in the estimated total energy capacity due to differences between manufacturers. In addition, when a set of rechargeable batteries is used repeatedly, errors in fuel gauging caused by capacity fading over the life of the battery are also mitigated. Likewise, differences in total available energy for different battery chemistries are accounted for either explicitly by optionally determining the chemistry and adapting to the determined chemistry or implicitly by assuming tat a given user will typically choose and stick with a particular battery chemistry. These and other features and advantages of the invention are detailed below with reference to the following drawings.

BRIEF DESCRIPTION OF THE DRAWINGS

The various features and advantages of the present invention may be more readily understood with reference to the following detailed description taken in conjunction with the accompanying drawings, where like reference numerals designate like structural elements, and in which.

MODES FOR CARRYING OUT THE INVENTION

Figure 1:
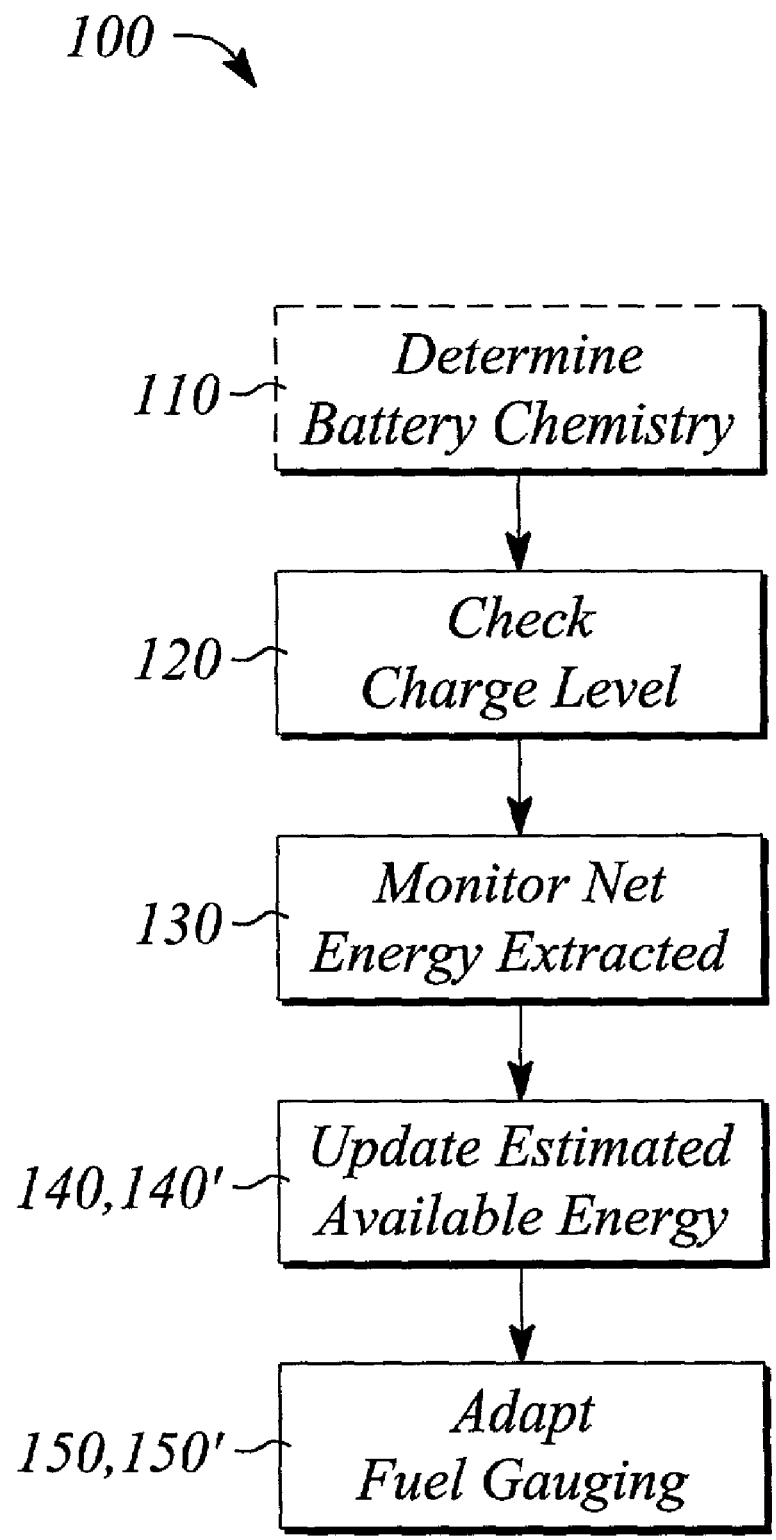
FIG. 1 illustrates a flow chart of a method of fuel gauging according to the present invention.

The present invention is a method of use-adaptive fuel gauging and an electronic device that incorporates use-adaptive fuel gauging. The use-adaptive fuel gauging of the present invention adapts a fuel gauge algorithm to an average use model to which a given device is subjected. The adaptation accounts for the effects that variations in average use by a user of the device have on a total available energy or charge capacity of a battery. Thus, use-adaptivity according to the present invention can improve the fuel gauging accuracy by improving an estimate of the total energy available. In addition, the method and device of the present invention optionally account for different battery chemistries yielding further increases in fuel gauging accuracy compared to conventional fuel gauging approaches.

The use-adaptive fuel gauging of the present invention is applicable to all battery powered electronic devices, especially those that are capable of using battery types available in multiple different battery chemistries and those that exhibit potentially large variations in use models from one user to another. In addition, the method is applicable to electronic devices that can accept either re-chargeable or non-rechargeable battery types. Examples of different battery chemistries available for use in electronic devices include, but are not limited to, alkaline, high energy alkaline, nickel-metal hydride (NiMH), nickel-cadmium (NiCd), and photo lithium (Li—$FeS_2$), all of which are commercially available in a variety of form factors including an 'AA' form factor. Examples of battery-powered electronic devices according to the present invention include, but are not limited to, notebook and laptop computers, hand-held computers and personal digital assistants (PDAs), digital cameras, including video cameras, and cellular telephones.

In addition to improved fuel gauging accuracy, the use-adaptive fuel gauging of the present invention improves battery end of charge detection and, when optional battery chemistry determination is employed, can even be used to prevent attempts to accidentally recharge non-rechargeable batteries. Advantageously, use-adaptive fuel gauging of the present invention often can be realized in an electronic device having conventional fuel gauging as a firmware upgrade without requiring hardware modifications to the device.

In one aspect of the invention, a method 100 of use-adaptive fuel gauging is provided. The method 100 collects and records data regarding the actual available energy delivered to a device by a succession of batteries used by the device. The recorded data is used either to update a history from which an estimate of a total available energy of a battery used by the device is generated or to update the estimate. The updated estimated total available energy then is used to adjust a fuel gauge algorithm employed by the fuel gauging of the device to produce a more accurate fuel gauge reading. Since the estimated total available energy of the battery is derived from actual or measured use data, the estimate represents an actual use model for the device. Since many users habitually use a given device in a consistent manner and often habitually use batteries of a same type or brand, the estimate can provide a very accurate value for total available energy that accounts for a number of user-specific and use-specific variables.

A flow chart of the method 100 of use adaptive fuel gauging according to the present invention is illustrated in FIG. 1. The method 100 of fuel gauging comprises optionally determining 110 battery chemistry. In optionally determining 110 battery chemistry, a characteristic or set of characteristics for the battery is measured under one or more battery load conditions. In a preferred embodiment, the measurements are performed in situ and can be performed using conventional battery monitoring circuitry of the electronic device. Results data from the measurement are compared to 'known' or predetermined characteristic values for a set of battery chemistries that may be used by the device. From the comparison, a determination 110 of battery chemistry is made. In the preferred embodiment, the comparison uses a look-up table that stores the characteristics of candidate battery chemistry characteristics.

Battery chemistry is optionally determined 110 during each power-up or 'boot' sequence carried out by the electronic device. In addition, for electronic devices that can detect battery replacement, the battery chemistry is optionally determined 110 preferably each time a battery is detected as having been replaced or a battery compartment is opened or accessed. While it is generally not necessary, battery chemistry determination 110 can be performed at other times during operation.

Figure 2A:
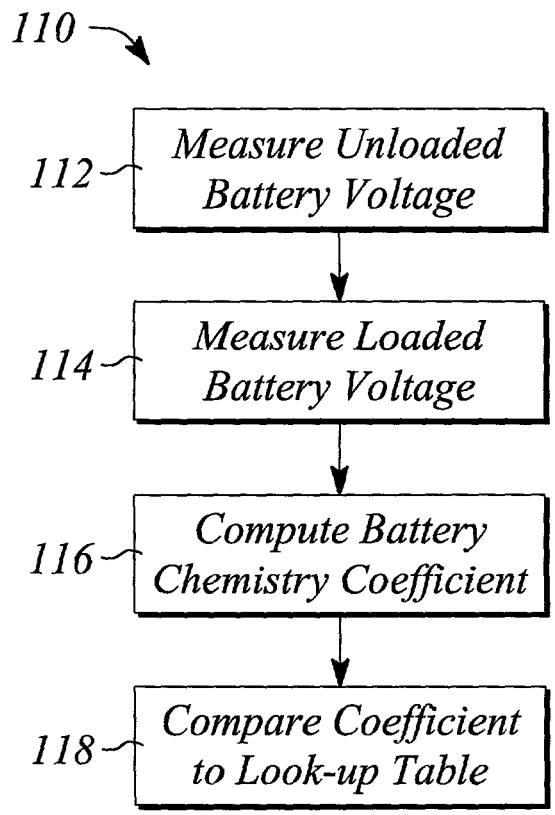
FIG. 2A illustrates a flow chart of an optional method of determining battery chemistry for the method of fuel gauging illustrated in FIG. 1.

There are a variety of ways to determine 110 battery chemistry, all of which are within the scope of the present invention. A flow chart of a preferred embodiment of a method of determining 110 battery chemistry of the present invention is illustrated in FIG. 2A. In the preferred embodiment, the optional method of determining 110 battery chemistry comprises measuring 112 the battery voltage in an 'unloaded' or idle condition to produce a measured unloaded battery voltage value. The optional method of determining 110 further comprises measuring 114 the battery voltage in a 'loaded' condition to produce a measured loaded battery voltage value. An unloaded condition is defined as a situation wherein the battery is subjected to a low current drain while a loaded condition is defined as a situation wherein the battery is subjected to a moderate to high current drain. Alternatively, a voltage that is proportional to the battery voltage may be measured 112, 114 instead of the actual voltage across the battery itself.

The preferred embodiment of the optional method of determining 110 battery chemistry further comprises computing 116 a battery chemistry coefficient from measured values of the loaded and unloaded battery voltages. One such battery chemistry coefficient is computed by taking a ratio of the measured 112, 114 values of the unloaded and loaded battery voltage. One skilled in the art can readily devise other useful battery chemistry coefficients all of which are within the scope of the present invention. The main function of the battery chemistry coefficient is to provide a reliable means for distinguishing between various battery chemistries.

The preferred embodiment of the optional method of determining 110 battery chemistry further comprises comparing 118 the battery chemistry coefficient to a set of candidate battery chemistry coefficients or, more particularly, to a set of battery chemistry coefficient ranges for candidate battery chemistries. Preferably, the coefficient ranges are stored in a look-up table. The comparison 118 of coefficients results in a choice of a particular battery chemistry from among the possible, candidate battery chemistries represented by the coefficient ranges in the look-up table. In essence, the comparison 118 produces a 'best guess' of an actual battery chemistry, the accuracy of which is limited only by an effective discrimination power or capability of the battery chemistry coefficient and the accuracy and applicability of look-up table data.

While defined hereinabove, the actual definitions of the unloaded condition and the loaded condition are usually device specific. As already mentioned, the unloaded condition should represent a lower load or current drain on the battery than is evident in or represented by the loaded condition. Preferably, a relative difference in battery load levels between the loaded and unloaded conditions is relatively high. More preferably, the relative difference in load levels is as high as is normally experienced by the battery during normal device operation.

For example, if the device is a digital camera, an unloaded condition might be the load experienced by the battery during or immediately following a start-up process. A loaded condition might be defined as the load condition experienced by the battery during a lens extension or a strobe of a flash bulb. In another example, a loaded condition for a compact disk (CD) player might be defined to occur when 'spinning up' the CD. Likewise, the unloaded condition for the CD player might be defined as occurring when the CD is not spinning, but the player is ON. In general any two relatively repeatable but different load conditions normally present in the device can be used as the loaded and unloaded conditions. However in general, the greater the difference in load levels, the more reliable will be the results of the battery chemistry determination 110.

Given that the definition of unloaded and loaded conditions are device specific, the coefficient ranges in the look-up table are likewise device specific. Typically, it is preferred that the look-up table coefficient ranges be generated empirically. That is, preferably the look-up table coefficient ranges are generated for the specific loaded and unloaded conditions to which the battery is subjected in the device. This way, the subsequent application of the optional method of determining 110 results in an accurate determination of battery chemistry. One skilled in the art is familiar with the construction and use of this sort of empirically derived look-up table for an electronic device. A co-pending patent application of Bean et al., entitled "Battery Fuel Gauging Using Battery Chemistry Identification", Ser. No. 09/943,058, filed Aug. 29, 2001, further describes this method of determining according to the preferred embodiment. The co-pending patent application Ser. No. 09/943,058 is incorporated by reference herein.

As mentioned hereinabove, other methods beyond that described hereinabove for determining battery chemistry are applicable to the present invention. For example, Bean et al., U.S. Pat. No. 6,215,275, incorporated herein by reference, discloses a method of battery determination or identification that utilizes a simple test circuit in conjunction with a microcontroller that measures several distinct voltages across a battery to determine battery chemistry. In another example, a co-pending application of Bean et al., entitled "A Method Of Battery Chemistry Identification Through Analysis Of Voltage Behavior", Ser. No. 09/859,015, filed May 14, 2001 discloses several in situ measurements of battery voltages under various loaded and unloaded battery conditions for battery chemistry determination. The co-pending application Ser. No. 09/859,015 is incorporated by reference herein also. The cited methods, as well as any other method that one skilled in the art might devise to determine battery chemistry of a battery inserted into an electronic device, are within the scope of the present invention.

Figure 2B:
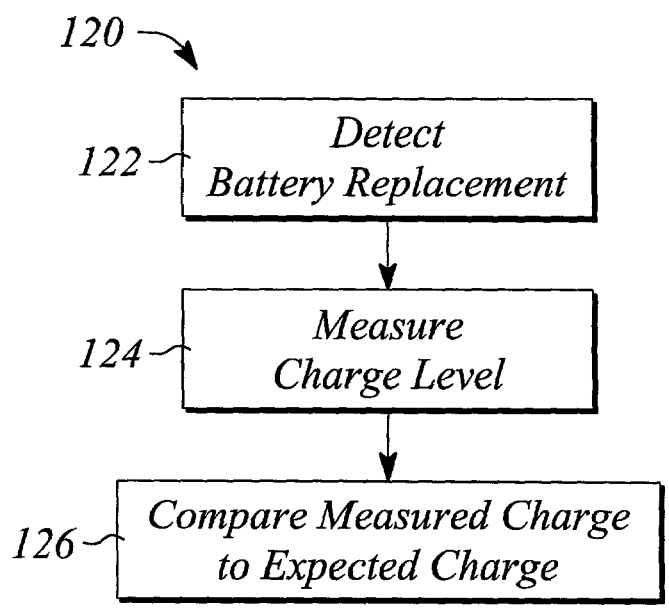
FIG. 2B illustrates a flow chart of a method of checking a charge level of a battery for the method of fuel gauging illustrated in FIG. 1.

The method 100 of use-adaptive fuel gauging further comprises checking 120 a charge level of the battery. FIG. 2B illustrates a flow chart of a method of battery charge-level checking 120. The method of checking 120 comprises detecting 122 when the battery has been replaced, also known as a 'battery replacement event'. When a battery replacement event is detected 122, the method of checking 120 further comprises measuring 124 a charge level of the battery and comparing 126 the measured charge level to an expected charge level range to determine if the battery is fully charged. Preferably, the charge level is determined from an equivalent measure, such as a voltage of the battery, in which case the voltage is measured 124 and compared 126 to an expected voltage for a fully charged battery.

The term 'fully charged', as used herein, refers to an arbitrary level of charge or energy stored in the battery. In the case of rechargeable batteries, a fully charged battery is one that no longer increases significantly in voltage when a charging current at a voltage higher than the nominal cell voltage is applied. For non-rechargeable batteries, a fully charged battery is one that has not been used and has been manufactured recently enough that the charge has not degraded substantially due to time. A non-rechargeable battery that has been used can be considered 'fully charged' according to the present invention if the battery has approximately 85% or more of the stored energy of a new, unused battery. Likewise, the expected voltage or expected value of the equivalent measure used to determine the charge level is arbitrary.

Typically, although not always, the expected charge range-comparison 126 comprises using a look-up table. The measured 124 charge level or its equivalent is compared 126 to a value or set of values in the look-up table. If the optional method of determining 110 battery chemistry has been performed, the determined chemistry result can be used in conjunction with the measured value to determine whether or not the battery is fully charged. Essentially, if the charge level (e.g. measured voltage) is high enough or falls within the expected range of voltages, the battery is determined to be fully charged. If the battery is not fully charged, the method 100 preferably waits for another battery replacement event.

The charge level is checked 120 at least once each time the battery is changed or otherwise removed and replaced in the device. Preferably, a determination is made as to whether or not the battery has been changed during each start-up sequence of the device and then, if it has been changed, the charge level is checked 120. If the battery has not been replaced, the charge level need not be checked 120.

A number of ways can be devised for determining if the battery has been replaced. For example, the device can be equipped with a sensor or switch that monitors a compartment door of a battery compartment. The sensor detects whether or not a compartment door has been opened. When the door is opened, it is assumed that the battery has been replaced. If such an event is detected, a record of the event is generated. Thus, if the battery door is opened, as indicated by the event record, it is assumed that the battery has been changed and the charge level is checked 120.

The event record can be a settable logic bit in a circuit of the device or of the sensor that is set by the sensor when it detects the battery replacement event. Alternatively, the event record can be a variable, such as a Boolean variable, in a software program that is altered (e.g., changed from false 'F' to true 'T') to indicate the detection of a battery replacement event. In yet another embodiment, the event record can be a logic '1' stored in a predetermined memory location in a memory associated with the device where a logic '0' stored at the same location indicates no detection of the replacement event. One skilled in the art is familiar with, and can readily devise a variety of means for, recording the occurrence of a battery replacement event, all of which are within the scope of the present invention.

Another example way to determine if a battery replacement event has occurred is to continuously monitor a voltage of the battery. It is assumed that the battery has been removed if the monitored voltage drops to approximately zero at any point during monitoring. This is usually done while the device is in low level operation under power provided by a backup power source, such as a backup battery or super/ultracapacitor. Thus a battery replacement event is indicated when the monitored voltage drops to zero and then returns to a non-zero value. Upon detecting a return of the monitored voltage to a non-zero value, a record is made indicating the detection of the replacement event. The record can take the same form as that described hereinabove for the first example.

Advantageously, many electronic devices maintain some active circuitry even when the device is turned 'OFF'. In such devices, a battery replacement event can be recorded using either of the two above-referenced example approaches even while the device is 'OFF'. An example of active circuitry in a device that is turned 'OFF' is the use of a microcontroller to monitor push buttons for 'ON/OFF' switching and/or the maintenance of a real time clock that records elapsed time while the device is turned 'OFF'.

Yet another example of a way of detecting a battery replacement event is to measure a battery voltage just before the device is turned 'OFF' and just after the device is turned 'ON'. The measured voltages are compared. If there is a difference greater than can be explained by the difference in recently loaded and recently unloaded readings, a battery replacement event is indicated and a record of the event is generated.

Still another way to detect a battery replacement event is the use of a user input or a response to a query from the device. For example on start-up, the device can query the user to determine if the battery has been replaced. A response from the user then determines whether or not the replacement event has occurred. These latter two approaches are applicable both to devices that maintain stand-by power and limited operation when turned 'OFF' and to those that do not. The former two ways of detecting a battery replacement event are preferred, since the latter two are susceptible to errors. One skilled in the art can readily devise other approaches to detecting whether or not the battery has been replaced. All such approaches are within the scope of the present invention.

As mentioned hereinabove, the charge level is checked 120 to determine whether a battery is fully charged just after it is replaced. While the method 100 can be used with a battery that is not fully charged, preferably the method 100 is used only with a fully charged battery. The difficulty of using the method 100 with less than fully charged batteries will become clear with the discussion hereinbelow. In short, the difficulties are related to an uncertainty in the battery charge level determination if the battery is not fully charged and how an error in the charge level may impact the balance of the use-adaptive fuel gauging method. Thus, the charge level is checked 120 preferably repeatedly until it is determined that a battery that is most likely fully charged has been detected.

The method 100 of use-adaptive fuel gauging further comprises monitoring 130 net energy extracted or drained from the battery by the device. As mentioned above, preferably the battery is a fully charged battery. The net energy extracted is monitored 130 for each detected fully charged battery installed in the device. The net energy extracted from the battery is monitored 130 during use in the device until the battery is fully discharged. The step of monitoring 130 comprises determining the net energy extracted from the battery and recording a value representing the determined net energy in a memory of the device. The step of monitoring 130 continuously determines and periodically records net energy extracted. Preferably, the net energy extracted is monitored 130 only if the checked 120 charge level determines that the battery is fully charged.

It is preferred that the detected battery be fully charged before the net energy extracted is monitored 130 to avoid degrading the usefulness of data recorded by the step of monitoring 130. However, it is within the scope of the present invention to monitor net energy extracted from a detected battery that is not fully charged. The data recorded for the non-fully charged battery can be prorated to prevent degradation of the recorded data for the fully charged batteries, provided that at least an approximation of the starting charge level is known.

For non-rechargeable batteries and for a device that does not provide on-board recharging, the net energy extracted is simply the energy extracted from the battery. For batteries that can be recharged in the device, the net energy extracted is a difference between energy that flows into the battery and the energy that flows out of the battery during device operation. For simplicity and without loss of generality or reduction in the scope of the present invention, the discussion hereinbelow focuses on batteries in devices that do not provide on-board recharging unless otherwise specified. One skilled in the art can readily extend the concepts described hereinbelow to devices that do provide on-board recharging of the battery.

Energy flowing into and out of the battery and therefore, the net energy extracted, can be determined either directly or indirectly during the device operation. Net energy extracted is determined directly by measuring a net energy flow out of the battery. For example, a current I and a voltage V at a terminal of the battery can be measured as a function of elapsed time $t_{operation}$ for the operation. As is well known in the art, power P is a product of current I and voltage V (i.e., P=I* V) and energy E is power multiplied by a duration or elapsed time t. Thus, energy flow for the operation is simply power P multiplied by the elapsed time $t_{operation}$.

Energy flow into a battery can be determined in an analogous manner. Advantageously, according to method 100, energy flow into the battery is determined only if the battery is a rechargeable battery that is recharged in the device. In most cases, such on-board recharging employs a so-called constant current charging system. When a constant current charging system is used, only elapsed time of charging is monitored, since energy flow into the battery can be determined from the elapsed time and the constant current, as is well known in the art.

Alternatively, the net energy extracted can be determined indirectly by keeping track of operations performed by the device and using known energy consumption characteristics associated with each of the operations. Essentially, if the amount of energy consumed by a given operation is known, then when the device performs that operation, the net energy extracted from the battery is simply the known amount of energy consumed by that operation. Data for known amounts of energy per operation are generally determined empirically for a given device type by a manufacturer of the device and stored in memory of the device for later use in determining the net energy extracted. The data is often stored in the form of a look-up table that has an entry for each unique operation of the device.

In some cases, a total energy consumed by the device when performing a given operation is known a priori. Such operations are ones that have a consistent or relatively consistent duration and repeatable power utilization. For such operations, the energy extracted from the battery each time such operation is performed by the device is determined by simply noting that such operation has been performed and using the a priori knowledge of energy consumed. The net energy value for that operation is found in the look-up table and used as the net energy extracted.

In other cases, the duration of some operations may not be consistent so that a priori knowledge of total energy consumed by the device cannot be obtained. In such cases, a predetermined, known power consumed by the device during each one of these operations is used to determine the net energy extracted. For such operations of inconsistent duration, the net energy extracted is determined by measuring the elapsed time $t_{operation}$ of such operation. The measured elapsed time $t_{operation}$ is then multiplied by a known power value found in the look-up table for such operation to compute the net energy extracted for that instance of the operation. Thus, by tracking the operations performed by the device and using either an energy consumption that is known a priori or a combination of a known power and the measured elapse time $t_{operation}$ for each operation, the extracted energy is determined.

To further illustrate the concept of determining the net energy extracted, consider the example of a digital camera. A first operation, e.g., that of recording an image, consumes a relatively consistent and repeatable amount of energy $E_{picture}$ for each image recorded. A second operation, e.g., that of viewing an image on an LCD display, consumes a relatively consistent amount of power $P_{LCDON}$ while the display is active. However, an amount of energy $E_{LCDON}$ consumed by the operation of viewing depends on how long a user actually keeps the LCD display active (i.e., an elapsed time $t_{LCDON}$). Thus, while the energy $E_{LCDON}$ consumed by a given viewing operation may not be consistent from one instance of the viewing operation to another, the energy $E_{LCDON}$ consumed can nonetheless be computed as the product of power $P_{LCDON}$ consumed and the elapsed time $t_{LCDON}$ (i.e., $E_{LCDON}=P_{LCDON} \cdot t_{LCDON}$). Thus, for each imaged recorded, the net energy extracted from the battery increases by an additional $E_{picture}$ amount of energy, while each instance of a viewing operation adds an amount of $E_{LCDON}=P_{LCDON} \cdot t_{LCDON}$ energy to the net energy extracted total.

In practice for method 100, indirect determination of net energy extracted is often preferred over direct determination due to the relative ease of indirect determination implementation. All that is required to implement indirect determination is that the energy consumed by each possible operation and instance of that operation be known or at least computable from known data. No specialized monitoring or measuring equipment is required. Additionally, indirect determination generally requires less processing power on the part of a controller of the device. On the other hand, if measured data for energy flow is readily available, the monitored 130 results with respect to the method 100 will likely be more accurate and thus preferred over the estimation approach.

The net energy extracted is recorded in device memory as data when monitored 130 according to the method 100 of the present invention. The specific way in which the net energy data is recorded typically depends on how the data is to be used and how much memory is available for storing the net energy data. In most cases, the net energy data is preferably recorded by periodically updating a running sum of net energy extracted from the battery with a latest determined net energy extracted value. The running sum represents a total net energy extracted from the battery as of the last update. When the battery is fully discharged, the running sum contains the total net energy extracted from the battery.

Alternatively, the net energy extracted during predefined periods of device operation can be recorded for the step of monitoring 130. In this case, the total net energy extracted from the battery is computed as a sum of the net energy extracted during each of the respective predefined recording periods. The step of monitoring 130 further comprises an optional step of recording a battery voltage at predefined periods during device operation. Recording a battery voltage comprises measuring a battery voltage value and recording the measured value in memory of the device. If the battery voltage values are recorded at periods that correspond to recording periods for recording net energy extracted, a curve or relationship between battery voltage and net energy extracted as a function of time during battery discharge can be constructed using the values.

As discussed hereinabove, the step of monitoring 130 is performed until the battery is fully discharged. A fully discharged battery is one in which a charge remaining drops below a predetermined cut-off point. The cut-off point is generally defined as a point during the discharge of the battery when the battery can no longer sustain the normal operation of the device. In most electronic devices, the cut-off point is a point when the battery voltage drops below a cut-off voltage. Below the cut-off voltage, a power supply of the electronic device can no longer produce the necessary regulated operating voltages for normal device operation. When the battery reaches the cut-off point, the battery is considered to be fully discharged. A total net battery energy extracted is then either a final value of the running sum recorded during the step of monitoring 130 or is value computed by summing the periodic net energy extracted values recorded during the step of monitoring 130.

The method 100 further comprises updating 140 an estimated total available energy from a battery installed in the device. Preferably, the estimated total available battery energy is updated 140 by computing an average of a previous estimated total available energy and the total net energy extracted from a most recently installed battery. The previous estimated total available energy is a value that was computed previously, e.g., for a previously installed battery. Alternatively, the estimate can be computed as a moving average of a value for the total net energy extracted from the most recently installed battery and a net energy extracted value for several previously installed batteries. The moving average computes an average of a most recent value and one or more previously recorded values. For example in using a moving average, the estimated total available energy may be the sum of a current recorded value and five previously recorded values or net energy extracted values for five respective previous batteries.

The method 100 of use-adaptive fuel gauging further comprises adapting 150 fuel gauging according to the estimated total available energy. The fuel gauging is adapted 150 typically in parallel with the step of monitoring 130 and thus, utilizes an existing estimated total energy produced by a previous execution of the method 100. Moreover, the step of adapting 150 depends on the specific fuel gauge algorithm being employed in a given device. In a preferred embodiment, the fuel gauging employs an energy monitoring fuel gauge algorithm. In an alternate embodiment, a voltage slope monitoring fuel gauge algorithm is employed. The step of adapting 150, as it applies to each of the energy and voltage slope principal types of fuel gauging, will be described in more detail hereinbelow. One skilled in the art can readily extend the following discussion regarding fuel gauge adaptation 150 to other fuel gauging types without undue experimentation.

With fuel gauging that employs the energy-monitoring algorithm, an amount of energy used by the device or extracted from the battery is monitored 130 and a cumulative energy used value is periodically updated 140. A difference between the cumulative energy used value and a value for total energy available then generates a fuel gauge result or reading. The difference is preferably converted to a percent remaining energy or charge by dividing the difference by the total energy value and then multiplying the result by one hundred. The percent remaining energy can be displayed as an alphanumeric result or in a graphical format, such as a bar graph or pie chart. Alternatively, the difference or the percent remaining energy can be compared to one or more threshold values indicating one or more states of battery fuel level. A result of the comparison is then used to generate a displayed result typically in the form of an iconic fuel gauge display.

According to the method 100 of the present invention, fuel gauging using energy monitoring employs the estimated total available energy of a previous step of updating 140 as the total energy value. Thus, the fuel gauge result is based on the difference between a cumulative energy used value and the estimated total available energy. Advantageously, the cumulative energy used is equivalent to the running sum of net energy extracted determined in the step of monitoring 130. Moreover, since the estimated total energy is based on an average of the total available energy determined for a number of previous batteries used in the device, the fuel gauging adapts 150 to a pattern of use by the user and to an average battery type by virtue of using the estimate. Furthermore, if a user consistently uses batteries of the same chemistry and from a particular manufacturer, the estimated total available energy will reflect these choices as well and the fuel gauging will implicitly adapt 150 to a chemistry and even a specific manufacturer.

Alternatively, if the optional step of determining 110 battery chemistry is conducted, as described above, a separate estimated total available energy value can be updated 140 for each of the different determined 110 chemistries. With the optional step of determining 110, the fuel gauging adapts 150 by first selecting a respective estimated total available energy for the determined 110 chemistry and then generating the fuel gauging results based on the selected estimated total available energy value for that chemistry. Thus, the fuel gauging is explicitly adapted to the chemistry when the chemistry is optionally determined 110. As before, consistent use patterns and even battery manufacturer are still represented by the selected estimated value so that the fuel gauging still adapts 150 to use patterns and battery manufacturer, as well as chemistry.

Fuel gauging that employs voltage slope monitoring generates an estimate of percent remaining energy by measuring a battery voltage and relating the measured voltage value to a percent remaining energy. The measured voltage can be related to percent remaining energy using a mathematical function, a curve, a graph or an equivalent, for example. For iconic fuel gauge displays, a comparison of the measured value to one or more threshold values is generally employed due to simplicity of implementation. In any case, the estimated total available energy is used to adapt or modify the relationship between the measured voltage and the percent remaining energy.

For example, if a function or curve is used to relate measured voltage to percent energy, a point in the curve can be adjusted up or down based on the estimated total available energy to adapt the fuel gauging. Likewise, threshold values can be adjusted based on the estimated total available energy. In each case, the relationship between measured voltage and percent remaining energy is being adapted to an average use pattern for the specific device based on historical data represented by the estimated total available energy.

On the other hand, voltage slope monitoring can advantageously avail itself of periodic net energy data and periodically recorded voltage values of the step of monitoring 130 described hereinabove. In particular, the periodic net energy data and periodically recorded voltage values describe a relationship between battery voltage and energy remaining in the battery. Thus, in another embodiment of the step of updating 140' an average voltage versus remaining energy curve can be produced. A current set of periodic net energy data and periodically recorded voltage values are averaged during the step of updating 140' with a previous set or sets to produce the average voltage versus remaining energy curve. The average curve is then used in a step of adapting 150' the fuel gauging prior to generating a fuel gauge reading, according to this embodiment. The average curve represents an average use pattern for the device in much the same way that the estimated total available energy does. Therefore, using the average curve to convert a measured voltage of the battery into a percent remaining power value effectively adapts 150' the fuel gauging. Likewise, as with using the estimated total available energy, different average curves can be maintained for each different optionally determined 110 battery chemistry.

The fuel gauge reading is generally made available to a user of the electronic device using some form of display. In general, fuel gauge readings can be displayed either in an alphanumeric format or in a graphical format. For example, a read-out on a display of '80% power remaining' is an example of an alpha-numeric format fuel gauge display, while a bar graph indicating remaining battery power is an example of a graphical format fuel gauge display. In some cases, the alphanumeric and graphical formats are combined to increase the usefulness of the displayed fuel gauge reading to the user.

Fuel gauge displays having graphical formats come in a variety of styles and are by far the most prevalent type or style of fuel gauge display. Most of the graphical-format fuel gauge displays can be classified as being either an iconic display or a graph display. An iconic fuel gauge display provides a relatively coarse indication of remaining battery power while graph displays typically provide a more detailed graphical indication of remaining fuel. For purposes of discussion herein, mechanical meters and displays that mimic mechanical meters are grouped with the graph displays.

Figure 3A:
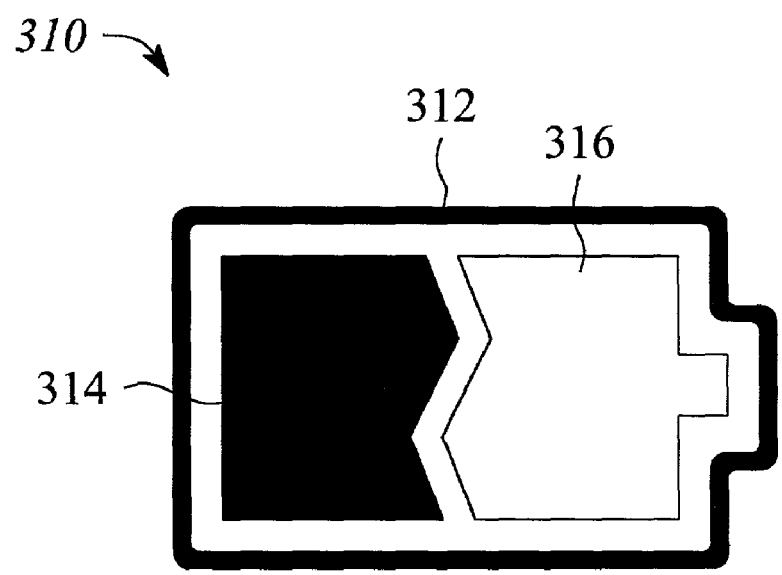
FIG. 3A illustrates an example of a three level iconic fuel gauge display.

FIG. 3A illustrates an example of a typical iconic fuel gauge display 310. The iconic display 310 illustrated in FIG. 3A is a so-called 'three-level' iconic display. The three-level iconic display 310 comprises a first region 312, a second region 314, and a third region 316. Each region 312, 314, 316 can be either illuminated or not illuminated as a means of indicating or displaying a fuel gauge reading or result. Such a three-level, iconic, fuel gauge display 310 is capable of indicating that the battery is either 'FULL' (i.e., fully charged), 'HALF FULL', or 'EMPTY'.

For example, if all three regions 312, 314, 316, of the iconic display 310 illustrated in FIG. 3A are simultaneously illuminated, the battery charge level is indicated to be 'FULL'. If only the first and second regions 312, 314 are illuminated, the fuel gauge display 310 indicates that the battery is 'HALF FULL' while the battery is considered to be 'EMPTY' or fully discharged when only the first region 312 is illuminated. The iconic display 310 illustrated in FIG. 3A indicates a fuel gauge reading of 'HALF FULL', by way of example only, wherein the illumination is depicted by solid dark shading. One skilled in the art is familiar with other iconic displays useful for fuel gauging, including ones that have more or less levels than the three-level iconic display 310. All such iconic displays are within the scope of the present invention.

Figure 3B:
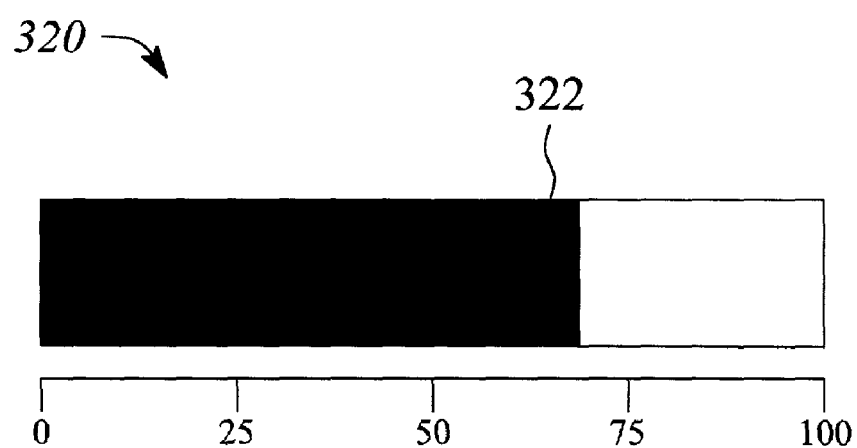
FIG. 3B illustrates an example of a graph style fuel gauge display.

FIG. 3B illustrates an example of a graph-style fuel gauge display 320. In particular, FIG. 3B illustrates an example of a bar-graph fuel gauge display 320. The bar-graph fuel gauge display 320 has an illuminated bar 322 (depicted by solid dark shading), the length of which varies according to an amount of power remaining in the battery based on the generated reading. Thus, the bar 322 of the bar-graph display 320 is longest when the battery is 'FULL' and shortest when the battery is 'EMPTY'. Typically, the length of the bar 322 can be varied linearly or nearly linearly as a function of the fuel gauge reading, thereby providing the user with a more precise indication of remaining power than can be accommodated by the typical iconic display 310. One skilled in the art is familiar with other graph-style displays that are useful for displaying fuel gauging results including, not limited to, pie charts, line graphs, and area or region graphs. All such graph-style displays are within the scope of the present invention.

Figure 4:
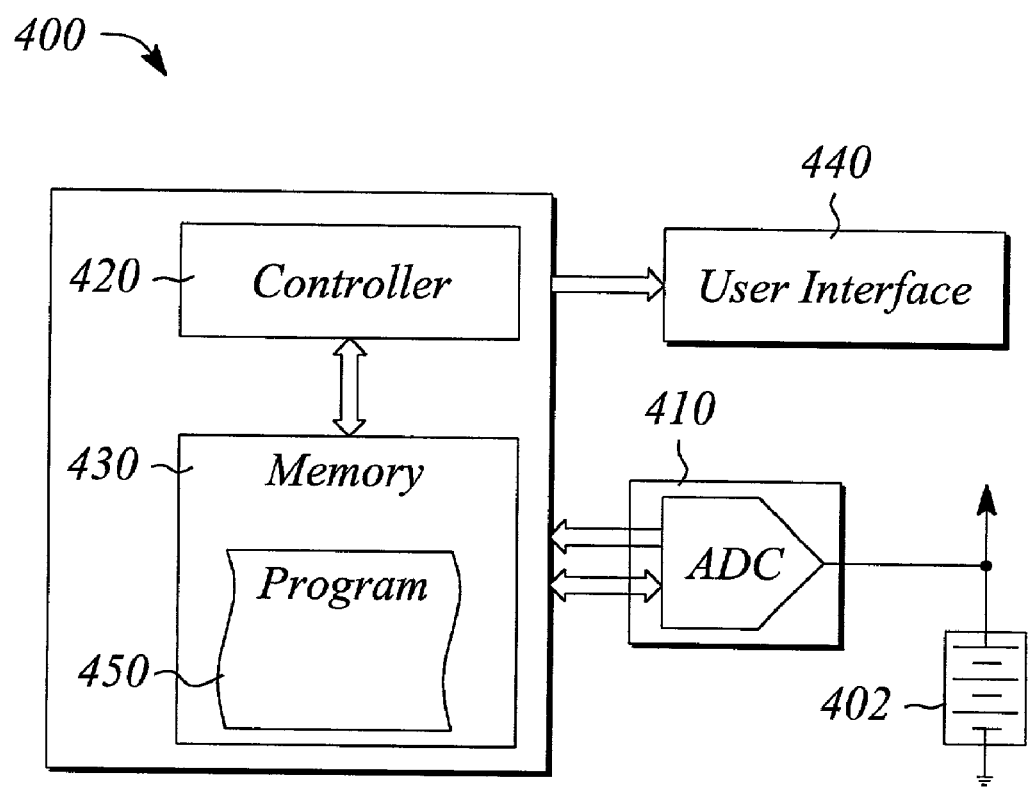
FIG. 4 illustrates a block diagram of an electronic device having use-adaptive fuel gauging of the present invention.

In yet another aspect of the invention, an electronic device 400 having use-adaptive fuel gauging of a battery 402 used to power the device 400 is provided. FIG. 4 illustrates a block diagram of an electronic device 400 having use-adaptive fuel gauging. The device 400 comprises a battery monitor 410, a controller 420, a memory 430, a display or user interface 440, and a fuel gauge algorithm in the form of a computer program 450 stored in the memory 430. Preferably, the fuel gauge algorithm implements the method 100 of use-adaptive fuel gauging of the present invention. The computer program 450 can be stored in the memory 430 as software or firmware. In one or more embodiments, the electronic device 400 further comprises the battery 402. The battery 402 can be any of the form factors and chemistries, described in more detail above, which are suitable for the electronic device 400.

The battery monitor 410 monitors a characteristic of the battery 402 and outputs measured data. The controller 420 executes the computer program 450 stored in the memory 430 and uses the data produced by the battery monitor 410. The controller 420 also controls the user interface 440 for the purposes of displaying fuel gauging results to a user of the device 400. The controller 420 is preferably a microprocessor or microcontroller. Alternatively, the controller 420 can be an application specific integrated circuit (ASIC) or a portion thereof.

The memory 430 is preferably computer memory. More preferably, the memory 430 is read/write memory, such as conventional random access memory (RAM). The memory 430 allows for the temporary storage of data, such as that produced by the battery monitor 420, and of temporary variables associated with the computer program 450 execution. The memory 430 may also include some read-only memory (ROM) especially for storing the program 450 when the device 400 is turned 'OFF'.

The computer program 450 preferably implements the method 100. In particular, the computer program 450, when executed by the controller 420, optionally determines battery chemistry, checks the charge level of a newly installed battery, monitors a net energy extracted from the battery, updates an estimated total available energy, and adapts the fuel gauging to the estimated total available energy. Although the computer program 450 is preferably implemented as firmware or software stored in the memory 430, the computer program 450 can be 'hard coded' in logic circuitry of the electronic device 400, such as in the form of a state machine and still be within the scope of the present invention.

The electronic device 400 can use the fuel gauge reading to control device operation with respect to a cut-off point in the battery discharge profile. For example, if the battery charge level, based on the generated fuel gauge reading or result, is found to be below the cut-off point, the electronic device 400 can be disabled or possibly just prevented from completing a normal start-up or 'boot' process. Thus, upon detecting a battery charge level at or below cut-off, advantageously the electronic device 400 can suspend the start-up process and begin a shutdown process. Equivalently, if the fuel gauge reading falls below the cut-off during operation, advantageously an automatic shutdown process can be initiated. As mentioned earlier, automatic detection of the cut-off condition in the battery charge level using the use-adaptive fuel gauging method 100 of the present invention can help to prevent loss of data or other problems associated with attempting to operate the device 400 with insufficient battery power.

In addition to the features and advantages related to fuel gauging accuracy described hereinabove, the method 100 and electronic device 400 of the present invention can advantageously distinguish a rechargeable battery type from a non-rechargeable battery type when the optional battery chemistry determination is employed. Therefore, the method 100 and device 400 also can be used to implement 'safe' in-device battery recharging. For example, the method 100 could provide information to a battery charging subsystem (not shown) in the electronic device 400 indicating whether the battery can be safely charged based on the battery chemistry determination. Likewise, the optional built-in chemistry determination of the electronic device 400 can be employed to self-detect whether or not the battery 402 is rechargeable. A battery charging subsystem of the device 400 can use the information to either connect or disconnect the battery 402 in the electronic device 400 from a battery-charging source (not illustrated). Moreover, the user interface 440 of the device 400 can display a message such as "Non-rechargeable batteries detected. Do not attempt to recharge." to warn the user of a problem.

In addition, the use-adaptive fuel gauging of the present invention can adapt to individual, distinct use patterns or models of one or more users. Advantageously, the present invention accommodates more than one user by employing more than one values of estimated total available energy, one for each user. For example, when a first user is using the device, a first estimated total available energy value is updated. When a second user is using the device, a second estimated total available energy value is updated and so on. A switch or other means provided by the device can be employed to identify the particular user to the device. Thus, if two users having different use patterns are sharing a given device, the use-adaptive fuel gauging can adapt differently and independently to each individual user.

Thus, there have been described a novel method 100 of use-adaptive fuel gauging and an electronic device 400 having use-adaptive fuel gauging. It should be understood that the above-described embodiments are merely illustrative of the some of the many specific embodiments that represent the principles of the present invention. Clearly, those skilled in the art can readily devise numerous other arrangements without departing from the scope of the present invention as defined by the following claims.

What is claimed is:

1. A method of fuel gauging in an electronic device having a battery, the method comprising:
adapting the fuel gauging in the device to a use model, the use model comprising how the device is actually used by a user, wherein adapting the fuel gauging comprises:
checking a charge level of the battery each time the battery is replaced;
monitoring a net energy extracted from the battery as a function of time during use of the device by the user;
updating an estimated total available battery energy, wherein the estimated total available battery energy is derived from the net energy extracted; and
adapting the fuel gauging to the updated estimated total available battery energy,
wherein checking the battery charge level comprises:
detecting a battery replacement event;
measuring the charge level of the battery; and
comparing the measured charge level to an expected charge level range.

2. A method of fuel gauging in an electronic device having a battery, the method comprising:
adapting the fuel gauging in the device to a use model, the use model comprising how the device is actually used by a user, wherein adapting the fuel gauging comprises:
checking a charge level of the battery each time the battery is replaced to determine whether the battery is fully charged;
monitoring a net energy extracted from the battery as a function of time during use of the device by the user;
updating an estimated total available battery energy, wherein the estimated total available battery energy is derived from the net energy extracted; and
adapting the fuel gauging to the updated estimated total available battery energy,
wherein checking the battery charge level comprises:
measuring the charge level of the battery; and
comparing the measured charge level to an expected charge level range, the expected charge level range being the range for a fully charged battery.

3. The method of claim 2, wherein only when a fully charged battery is determined, are monitoring, updating and adapting performed.

4. The method of claim 2, wherein the net energy extracted from the battery is determined directly by measuring a net energy flowing out of the battery.

5. The method of claim 2, wherein the net energy extracted from the battery is determined indirectly by keeping track of operations performed by the device and using known energy consumption characteristics associated with each of the device operations.

6. The method of claim 2, optionally further comprising periodically measuring a battery voltage during device operation, and recording the measured voltage in memory of the device.

7. A method of fuel gauging in an electronic device having a battery, the method comprising:
adapting the fuel gauging in the device to a use model, the use model comprising how the device is actually used by a user, wherein adapting the fuel gauging comprises:
monitoring a net energy extracted from the battery as a function of time during use of the device by the user;
updating an estimated total available battery energy, wherein the estimated total available battery energy is derived from the net energy extracted; and
adapting the fuel gauging to the updated estimated total available battery energy,
wherein updating an estimated total available energy from the battery comprises computing a moving average of a value for a total of the net energy extracted from a most recently installed battery and a value for a total of the net energy extracted for one or more previously installed batteries.

8. A method of fuel gauging in an electronic device having a battery, the method comprising:
checking a charge level of the battery;
comparing the checked level to an expected charge level range;
updating an estimated total available battery energy comprising computing a moving average of a value for a total of a net energy extracted from a most recently installed battery and a value for a total of the net energy extracted for one or more previously installed batteries; and
adapting the fuel gauging in the device to a use model, wherein the use model comprises how the device is actually used by a user, and wherein the battery is non-rechargeable.

9. The method of claim 8, further comprising:
determining a battery chemistry for the battery; and
Thither adapting the fuel gauging to the determined battery chemistry.

10. A method of fuel gauging in an electronic device having a battery, to method comprising:
updating an estimated total available battery energy, wherein updating comprises computing a moving average of a value for a total of a net energy extracted from a most recently installed battery and a value for a total of the net energy extracted for one or more previously installed batteries; and
adapting the fuel gauging in the device to a use model, wherein the use model comprises how the device is actually used by a user.

11. The method of claim 10, wherein the use model further comprises historical data of a total net energy extracted from each battery used in the device by the user.

12. The method of claim 10, wherein adapting the fuel gauging comprises:
monitoring the net energy extracted from the most recently installed battery as a function of time during use of the device by the user; and
adapting the fuel gauging to the updated estimated total available battery energy, the estimated total available battery energy being derived from the net energy extracted.

13. The method of claim 12, further comprising checking a charge level of the most recently installed battery prior to monitoring.

14. The method of claim 13, wherein checking battery charge level comprises:
measuring the charge level of the most recently installed battery; and
comparing the measured charge level to an expected charge level range.

15. The method of claim 14, wherein checking battery charge level further comprises detecting a battery replacement event prior to measuring the charge level of the most recently installed battery.

16. The method of claim 14, wherein checking battery charge level determines whether the most recently installed battery is fully charged, and in comparing, the expected charge level range is the range for a fully charged battery.

17. The method of claim 16, wherein monitoring, updating and adapting are performed only when a fully charged battery is determined.

18. The method of claim 12, wherein monitoring comprises:
determining the net energy extracted from the most recently installed battery; and
recording in a memory of the device a value representing the determined net extracted energy.

19. The method of claim 12, wherein the net energy extracted from the most recently installed battery is monitored until a cut-off point is reached in a discharge cycle of the most recently installed battery.

20. The method of claim 12, wherein the net energy extracted from the most recently installed battery is determined directly by measuring a net energy flowing out of the most recently installed battery.

21. The method of claim 12, wherein the net energy extracted from the most recently installed battery is monitored indirectly by keeping track of the operations performed by the device and using known energy consumption characteristics associated with each of the device operations.

22. The method of claim 12, optionally further comprising periodically measuring a battery voltage during device operation, and recording the measured voltage in memory of the device.

23. The method of claim 12, wherein updating an estimated total available energy from the most recently installed battery comprises computing an avenge of a previous estimated total available energy and a total of the net energy extracted from the most recently installed battery.

24. The method of claim 10, further comprising:
monitoring the net energy extracted from the most recently installed battery during use of the device by the user,
wherein die updated estimated total available battery energy represents the use model and the estimated total available battery energy is derived from the net energy extracted.

25. The method of claim 24, wherein the fuel gauging is adapted to the updated estimated total available battery energy by subtracting the net energy extracted from the updated estimated energy to generate a fuel gauge reading.

26. The method of claim 25, wherein the fuel gauging is adapted in parallel with monitoring, such that the fuel gauging is adapted to an existing estimated total available battery energy from a previous updating.

27. The method of claim 10, further comprising:
determining a battery chemistry for the most recently installed battery; and
further adapting the fuel gauging to the determined battery chemistry.

28. The method of claim 27, wherein a rechargeable battery chemistry is distinguished from a non-rechargeable battery chemistry.

29. An electronic device with use-adaptive fuel gauging, the electronic device using a battery for power, the electronic device comprising:
- a battery monitor that measures a characteristic of the battery;
- a controller that receives the measured battery characteristic from the battery monitor;
- a memory tat provides temporary data storage for the controller;
- a user interface that displays results produced by the controller, and
- a fuel gauge algorithm stored iii the memory as a computer program, the computer program comprising instructions that, when executed by the controller, check the charge level of a newly installed battery, monitor a net energy extracted from the newly installed battery, update an estimated total available energy, and adapt the fuel gauging to the estimated total available energy, wherein the instructions that update an estimated total available energy comprise instructions that compute a moving average of a value for a total of the net energy extracted from a most recently monitored battery and a value for a total of the net energy extracted for one or more previously monitored batteries.

30. The electronic device of claim 29, wherein the computer program further comprises instructions that implement optionally determining battery chemistry, and wherein the fuel gauging is further adapted to the determined battery chemistry.

31. The electronic device of claim 29, wherein the computer program is stored in the memory as either firmware or software.

32. The electronic device of claim 29, wherein the computer program is incorporated into logic circuitry of the electronic device.

33. The electronic device of claim 29, wherein the electronic device is a digital camera that further comprises an optical subsystem that is controlled by the controller.

34. The electronic device of claim 29, wherein the net energy extracted from the newly installed battery is monitored indirectly by keeping track of operations performed by the device and using known energy consumption characteristics associated with each of the device operations.

35. An electronic device with use-adaptive fuel gauging, the electronic device using a battery for power, the electronic device comprising:
- a battery monitor that measures a characteristic of the battery;
- a controller that receives the measured battery characteristic from the battery monitor;
- a memory that provides temporary data storage for the controller;
- a user interface that displays results produced by the controller; and
- a fuel gauge algorithm stored in the memory as a computer program, the computer program comprising instructions that when executed by the controller, update an estimated total available energy, and adapt the fuel, gauging in the device to a use model,
- wherein the instructions that update comprise instructions that compute a moving average of a value for a total of a net energy extracted from a most recently installed battery and a value for a total of the net energy extracted for one or more previously installed batteries, and
- wherein the use model comprises how the device is actually used by a user.

* * * * *

UNITED STATES PATENT AND TRADEMARK OFFICE
CERTIFICATE OF CORRECTION

PATENT NO. : 7,107,160 B2  Page 1 of 1
APPLICATION NO. : 09/974372
DATED : September 12, 2006
INVENTOR(S) : Heather N Bean It is certified that error appears in the above-identified patent and that said Letters Patent is hereby corrected as shown below:

In column 2, line 8, delete "front" and insert -- from --, therefor.

In column 2, line 13, delete "ninth" and insert -- much --, therefor.

In column 2, line 30, delete "furl" and insert -- fuel --, therefor.

In column 5, line 45, delete "tat" and insert -- that --, therefor.

In column 19, line 36, in Claim 9, delete "Thither" and insert -- further --, therefor.

In column 19, line 39, in Claim 10, delete "to" and insert -- the --, therefor.

In column 20, line 40, in Claim 23, delete "avenge" and insert -- average --, therefor.

In column 20, line 47, in Claim 24, delete "die" and insert -- the --, therefor.

In column 21, line 8, in Claim 29, delete "tat" and insert -- that --, therefor.

In column 21, line 11, in Claim 29, delete "controller," and insert -- controller; --, therefor.

In column 21, line 12, in Claim 29, delete "iii" and insert -- in --, therefor.

In column 22, line 23, in Claim 35, delete "that" and insert -- that, --, therefor.

In column 22, line 25, in Claim 35, delete "fuel," and insert -- fuel --, therefor.

Signed and Sealed this

Twelfth Day of May, 2009

JOHN DOLL
*Acting Director of the United States Patent and Trademark Office*